(12) United States Patent
Li

(10) Patent No.: US 7,029,288 B2
(45) Date of Patent: Apr. 18, 2006

(54) ELECTRICAL CONTACT AND CONNECTOR AND METHOD OF MANUFACTURE

(76) Inventor: Che-Yu Li, 5 Oakridge La., Roslyn, NY (US) 11576

( * ) Notice: Subject to any disclaimer, the term of this patent is extended or adjusted under 35 U.S.C. 154(b) by 0 days.

(21) Appl. No.: 10/940,457

(22) Filed: Sep. 14, 2004

(65) Prior Publication Data

US 2005/0048807 A1 Mar. 3, 2005

Related U.S. Application Data

(63) Continuation-in-part of application No. 10/736,280, filed on Dec. 15, 2003.

(60) Provisional application No. 60/503,007, filed on Sep. 15, 2003, provisional application No. 60/462,143, filed on Apr. 8, 2003, provisional application No. 60/457,258, filed on Mar. 25, 2003, provisional application No. 60/457,076, filed on Mar. 24, 2003.

(51) Int. Cl.
*H01R 9/09* (2006.01)

(52) U.S. Cl. ..................................................... 439/66

(58) Field of Classification Search ............... 439/66, 439/591, 71, 91, 700, 936, 736
See application file for complete search history.

(56) References Cited

U.S. PATENT DOCUMENTS

| | | | |
|---|---|---|---|
| 2,153,177 A | 4/1939 | Ecker | |
| 3,317,885 A | 5/1967 | Yost | |
| 3,513,434 A | 5/1970 | Zielke | |
| 3,686,926 A * | 8/1972 | Miller et al. | ................. 324/700 |
| 3,795,884 A | 3/1974 | Kotaka | |
| 4,029,375 A | 6/1977 | Gabrielian | |
| 4,729,739 A * | 3/1988 | Coffee et al. | ............... 439/936 |
| 4,810,213 A | 3/1989 | Chabot | |
| 4,820,376 A | 4/1989 | Lambert et al. | |
| 4,838,815 A | 6/1989 | Tajima et al. | |
| 4,922,376 A | 5/1990 | Pommer et al. | |
| 5,030,109 A | 7/1991 | Dery | |
| 5,061,191 A | 10/1991 | Casciotti et al. | |
| 5,101,553 A | 4/1992 | Carey | |
| 5,127,837 A | 7/1992 | Shah et al. | |
| 5,176,535 A | 1/1993 | Redmond et al. | |
| 5,215,472 A | 6/1993 | DelPrete et al. | |
| 5,228,861 A | 7/1993 | Grabbe | |
| 5,232,372 A | 8/1993 | Bradley et al. | |
| 5,308,252 A | 5/1994 | Mroczkowski et al. | |
| 5,350,308 A | 9/1994 | Laska et al. | |
| 5,382,169 A * | 1/1995 | Bailey et al. | ................. 439/66 |
| 5,385,477 A | 1/1995 | Vaynkof et al. | |

(Continued)

OTHER PUBLICATIONS

COSMOS Customer Successes; COSMOS helps analyze circuit board connectors; Internet pages; http://mcad.cosmo-sm.com/pages/successes/electronics7.html (4 pages).

(Continued)

*Primary Examiner*—Tho D. Ta
*Assistant Examiner*—Felix O. Figueroa
(74) *Attorney, Agent, or Firm*—Duane Morris LLP

(57) ABSTRACT

An electrical contact (2) and method of making the electrical contact (2), and a connector (11) and method making the connector (11), wherein the electrical contact (2) is an electrically conducting, interlaced mesh (40), with edges of the mesh providing multiple contact points for edgewise electrical connection of the electrical contact (2), wherein the mesh (40) is annealed while restrained in the form of the electrical contact (2) wherein the mesh (40) is free of internal elastic strain, or the mesh (40) is hardened, and wherein the connector (11) retains the electrical contact (2) for edgewise connection.

7 Claims, 11 Drawing Sheets

U.S. PATENT DOCUMENTS

| | | | |
|---|---|---|---|
| 5,403,194 | A | 4/1995 | Yamazaki |
| 5,427,535 | A | 6/1995 | Sinclair |
| 5,441,690 | A | 8/1995 | Ayala-Esquilin et al. |
| 5,473,510 | A | 12/1995 | Dozier, II |
| 5,495,397 | A | 2/1996 | Davidson et al. |
| 5,599,193 | A | 2/1997 | Crotzer |
| 5,653,598 | A | 8/1997 | Grabbe |
| 5,701,233 | A * | 12/1997 | Carson et al. ............... 439/66 |
| 5,791,914 | A | 8/1998 | Loranger et al. |
| 5,800,184 | A | 9/1998 | Lopergolo et al. |
| 5,806,181 | A | 9/1998 | Khandros et al. |
| 5,810,607 | A | 9/1998 | Shih et al. |
| 5,817,986 | A | 10/1998 | Davidson et al. |
| 5,823,792 | A | 10/1998 | Regnier |
| 5,833,471 | A | 11/1998 | Selna |
| 5,949,029 | A | 9/1999 | Crotzer et al. |
| 6,062,870 | A * | 5/2000 | Hopfer et al. ............... 439/66 |
| 6,074,219 | A | 6/2000 | Tustaniwskyj et al. |
| 6,142,789 | A | 11/2000 | Nolan et al. |
| 6,247,938 | B1 | 6/2001 | Rathburn |
| 6,264,476 | B1 | 7/2001 | Li et al. |
| 6,328,080 | B1 | 12/2001 | Winters |
| 6,471,554 | B1 | 10/2002 | Armistead et al. |
| 6,716,038 | B1 * | 4/2004 | Garcia ..................... 439/75 |
| 2003/0073329 | A1 | 4/2003 | Beaman et al. |

OTHER PUBLICATIONS

*Button Contacts for Liquid Nitrogen Applications;* Fran Almquist; IBM Corporation; 0569-5503/89/0088, IEEE, pp 88-91.

*A Novel Elastomeric Connector for Packaging Interncon-nections, Testing and Burn-in Applications;* D. Y. Shih et al.; 0569-5503/95/0000-0126; 1995 IEEE; pp 126-133.

*PC-nonlinear FEA makes the connection;* Design News; Internet pages from www.designnews.com (4 pages); Dec. 23, 2004.

CIN::APSE High Speed Interconnect Technology; Brochure; 5 pages.

*An Adaptable, High Performance LGA Connector Technology;* HCD, Inc.; Dirk D. Brown et al.; 6 pages.

*Two Fundamental Approaches to Enabling High Performance LGA Connections;* HCD, Inc.; Dirk D. Brown et al.; pp 508-514.

*Wafer-level CSP, Wafer-Level Asembly/test: Integrating Backend Processes;* Solid State Technology; John Novitsky et al.; internet page http://solidstate.articles.printhis.clickability.com; 7 pages.

*Z-Axis Interconnection for 3-D High Density Packaging;* 2001 International Symposium on Microelectronics; S. Spicsshoefor et al.; pp 167-171.

HCD—High Connection Density, Inc. Corporate Overview; 6 pages.

*Modular Subsystems and High Frequency Solutions;* Connector and Socket Product Overview; HCD—High Connection Density, Inc.; Apr. 2004; 12 pages.

*SuperButton Land Grid Array (LGA) Production IC Sockets;* HCD—High Connection Density, Inc.; www.hcdcorp.com, 1 page.

*Customable Multi-Contact-Point Interposer;* IBM Technical Disclosure Bulletin; Apr. 1994; pp 105-106.

*Special Thermal Conductive Interposers;* IBM Technical Disclosure Bulletin; Sep. 1993; pp 7-8.

*Passive Interposer Connection Scheme;* IBM Technical Disclosure Bulletin; May 1993; pp 249-252.

*Compressible-Contact Internconnection Scheme;* IBM Technical Disclosure Bulletin; Oct. 1990; pp 394-395.

*Improved Interconnection Structure;* IBM Technical Disclosure Bulletin; Nov. 1988; pp 17-19.

*Interposer Carrier;* IBM Technical Disclosure Bulletin; Jan. 1987; pp 3678-3680.

*Electrically Conductive Array in an Elastomeric Material;* IBM Technical Disclosure Bulletin; Sep. 1982; pp 1801-1802.

*High Density Area Array Connector;* IBM Technical Disclosure Bulletin; Apr. 1991; pp 4-5.

* cited by examiner

ELECTRICAL CONTACT AND CONNECTOR AND METHOD OF MANUFACTURE

CROSS-REFERENCE TO RELATED APPLICATIONS

This application claims the benefit of U.S. Provisional Patent Application No. 60/503,007, filed Sep. 15, 2003.

This application is a continuation in part of U.S. patent application Ser. No. 10/736,280, filed Dec. 15, 2003, which claims the benefit of U.S. Provisional Patent Application No. 60/457,076, filed Mar. 24, 2003, U.S. Provisional Patent Application No. 60/457,258, filed Mar. 25, 2003, and U.S. Provisional Patent Application No. 60/462,143, filed Apr. 8, 2003.

FIELD OF THE INVENTION

The present invention generally relates to electrical interconnection devices, and more particularly to electrical contacts that are at the interface between a first electronic device and a substrate or between an electrical connector and the same.

BACKGROUND OF THE INVENTION

Referring to FIG. 1, prior art LGA assemblies are used to interconnect an IC package A having a plurality of flat contact pads or solder bumps B formed on a bottom surface, to contact pads C arranged in a regular pattern on a surface of PCB D.

Prior art LGA assemblies are known which include an insulative housing E and a plurality of resilient conductive contacts F received in passageways formed in housing E. Resilient conductive contacts F typically have exposed portions at the upper and lower surfaces of insulative housing E for engaging flat contact pads B,C. When IC package A is accurately positioned in overlying aligned engagement with PCB D, such that conductive pads B engage conductive pads C, a normal force is applied to the exposed portions of each resilient conductive contact F to electrically and mechanically engage the respective contact pads B,C.

The resilient conductive contacts associated with prior art LGA's have had a variety of shapes. A commonly used form of resilient conductive contact includes two free ends connected by a curved, resilient portion which provides for the storage of elastic energy during engagement with the IC package and PCB. Prior art resilient conductive contacts may be a single metal structure in the form of a spring to provide the required elastic response during service while also serving as a conductive element for electrical connection. Alternatively, contact buttons have been developed in which a connector is wound around, embedded, or otherwise engaged with a dielectric core, which often provides for elastic energy storage during operation with the conductor merely providing an electrical conduction pathway. Typically, a combination of barrier metal and noble metal platings are applied to the surface of the spring for corrosion prevention and for electrical contact enhancement. It is often the case that these platings are not of sufficient thickness for electrical conduction along only the surface of the spring. Examples of such prior art resilient conductive contacts may be found in U.S. Pat. Nos. 2,153,177; 3,317,885; 3,513,434; 3,795,884; 4,029,375; 4,810,213; 4,820,376; 4,838,815; 4,922,376; 5,030,109; 5,061,191; 5,101,553; 5,127,837; 5,215,472; 5,228,861; 5,232,372; 5,308,252; 5,350,308; 5,385,477; 5,403,194; 5,427,535; 5,441,690; 5,473,510; 5,495,397; 5,599,193; 5,653,598; 5,791,914; 5,800,184; 5,806,181; 5,810,607; 5,817,986; 5,823,792; 5,833,471; 5,949,029; 6,074,219; and 6,264,476. The foregoing patents are hereby incorporated herein by reference.

A problem in the art exists in that, a conductive contact in the form of a single conductor spring for attaining high compliance, has a high resistance and a high inductance. Further, a contact, in the form of multiple conductors in a bunched wire bundle, or in the form of a conductor structure embedded in a polymer core, is made with lower resistance and inductance than a single conductor spring, but requires a high contact force for deflection, and is unable to attain high compliance. Further, one problem in the art exists in that a good material for the construction of a spring, such as a high strength steel, is not a very good electrical conductor. On the other hand, a good electrical conductor, such as a copper alloy or precious metal, often does not provide adequate spring properties. There is a need for a more resilient conductive contact which incorporates the seemingly opposing requirements of good spring properties, temperature resistance, and high conductivity, but without the need for any integral supporting structure. Therefore, an improved electrical contact for use in an LGA socket or electrical connector is needed which can overcome the drawbacks of conventional electrical contacts.

Thus, it is desirable that a good electrical contact element possesses the following attributes: (a) usable for both a production socket, as well as, test and burn-in sockets, where the latter use requires high durability; (b) a large elastic compliance range and low contact forces; (c) capable of transmitting high frequency signals and high currents; (d) capable of withstanding high operating temperatures; and (e) exhibiting high durability, i.e. >500K repeated deflections The prior art has been devoid of at least one of the foregoing attributes necessary for a universally applicable electrical contact. A problem in the art exists in that, a conductive contact in the form of a single conductor spring for attaining high compliance, has a high resistance and a high inductance. Further, a contact, in the form of multiple conductors in a bunched wire bundle, or in the form of a conductor structure embedded in a polymer core, is made with lower resistance and inductance than a single conductor spring, but requires a high contact force for deflection, and is unable to attain high compliance. Further, one problem in the art exists in that a good material for the construction of a spring, such as a high strength steel, is not a very good electrical conductor. On the other hand, a good electrical conductor, such as a copper alloy or precious metal, often does not provide adequate spring properties. There is a need for a more resilient conductive contact which incorporates the seemingly opposing requirements of good spring properties, temperature resistance, and high conductivity, but without the need for any integral supporting structure. Therefore, an improved electrical contact for use in an LGA socket or electrical connector is needed which can overcome the drawbacks of conventional electrical contacts.

SUMMARY OF THE INVENTION

The present invention provides an electrical contact. The terminology, electrical contact, is used herein interchangeably with the terminology, electrical contact element. An embodiment of an electrical contact in accordance with the present invention is an electrically conducting, interlaced mesh, wherein the mesh comprises an unsupported electrical contact substantially free of elastic strain, and the mesh is hardened. According to another embodiment of an electrical contact in accordance with the present invention, when a more compact form of electrical contact is desired, the contact is compressed to a compact form, and is annealed while constrained in the compact form to substantially relieve only the internal elastic strain. According to another embodiment of the invention, when added hardening is desired, the annealed structure is compressed to a more compact form of the individual electrical contacts, wherein a controlled amount of inelastic deformation results in added hardening.

In one embodiment, the present invention provides an electrical contact formed from a plurality of interlaced and annealed wires. The electrical contact is often formed by weaving or braiding a plurality of wires together to form a mesh, annealing the mesh, and cutting the annealed mesh so as to form a plurality of individual electrical contacts that each have an extended elastic range as a result of the annealing process. When a more compact form of electrical contact is desired, the contact is compressed to a compact form, and is annealed while constrained in the compact form to substantially relieve only the internal elastic strain. According to another embodiment of the invention, when added hardening is desired, the annealed structure is compressed to a more compact form of the individual electrical contacts, wherein a controlled amount of inelastic deformation results in added hardening.

A connector system may be formed in accordance with the invention including a housing defining a plurality of openings that are each filled with an electrical contact of the present invention. In one embodiment, a connector system may be formed including a housing defining a plurality of openings that are each filled with an electrical contact comprising a plurality of interlaced and annealed wires. The connector system may also include electrical contacts comprising a plurality of interlaced and annealed wires arranged in a unitary mesh having at least one pleat or formed in a tube structure, including, a square tube, a rectangular tube or a round tube.

BRIEF DESCRIPTION OF THE DRAWINGS

These and other features and advantages of the present invention will be more fully disclosed in, or rendered obvious by, the following detailed description of the preferred embodiments of the invention, which are to be considered together with the accompanying drawings wherein like numbers refer to like parts and further wherein.

DETAILED DESCRIPTION OF THE PREFERRED EMBODIMENTS

Figure 1:
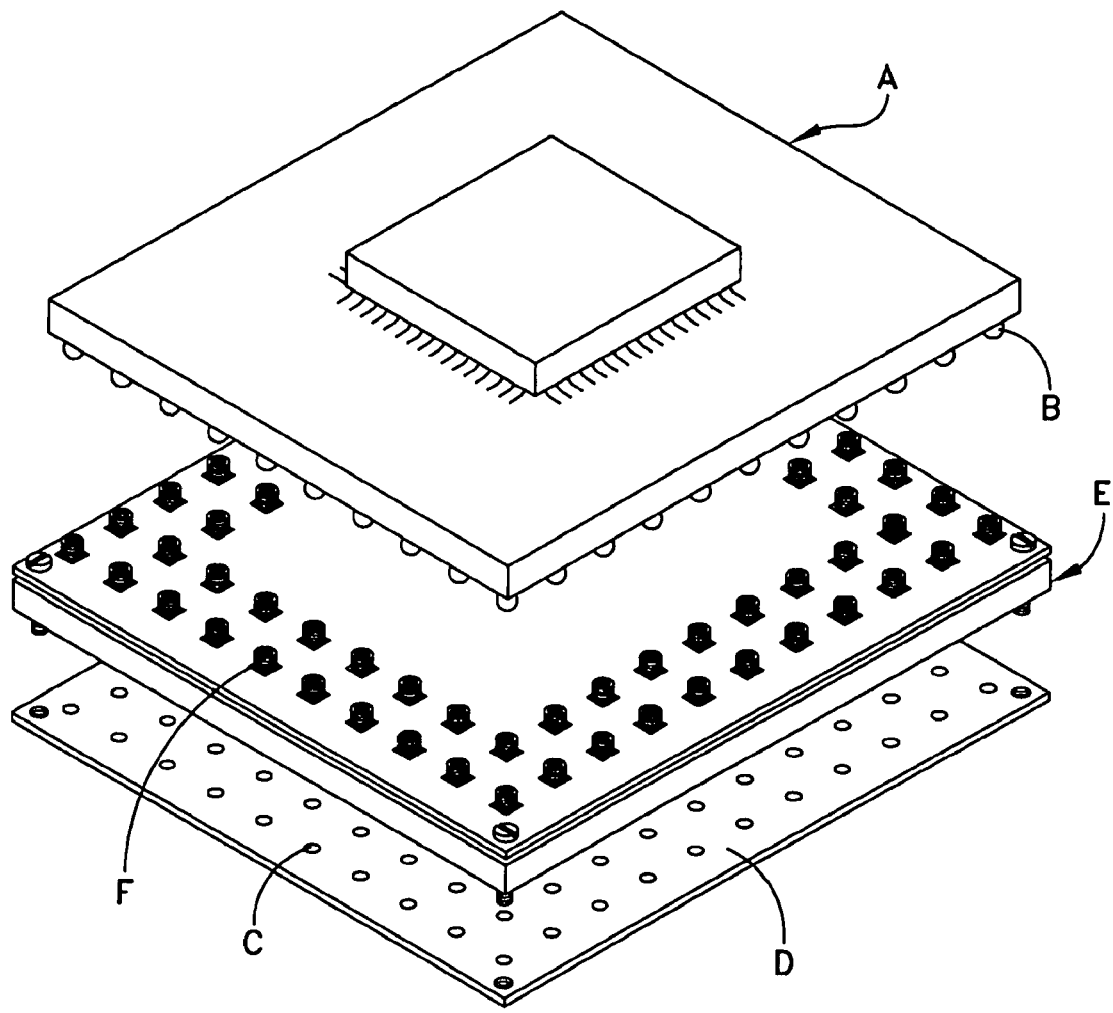
FIG. 1 is a perspective exploded view of a prior art land grid array assembly.
Figure 1A:
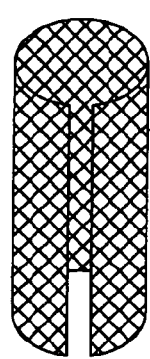
FIG. 1A is an isometric view of a cage configuration, including a tubular configuration.
Figure 1B:
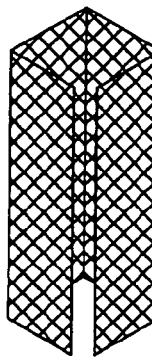
FIG. 1B is an isometric view of a cage configuration, including a square.
Figure 1C:
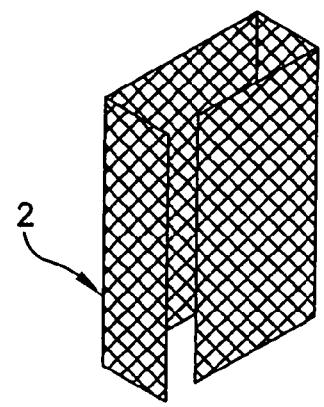
FIG. 1C is an isometric view of a cage configuration, including a rectangle.
Figure 1D:
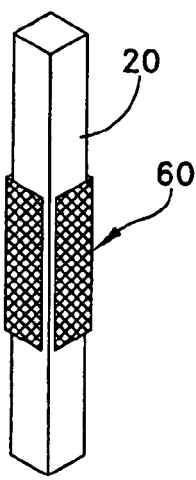
FIG. 1D is an isometric view of a mandrel and a mesh shaped over the mandrel.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate.

Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

The present invention provides an electrical contact 2 that comprises a large elastic range as a result of being formed so as to comprise an interlaced or woven, annealed metal structure that provides a plurality of individual beam-sections 6. Electrical contact 2 may be formed by weaving at least three or four discrete wires 8 together, i.e., manipulating the wires together so as to interlace them to form a unitary structure, to thereby form an electrical contact precursor mesh 12, 40 in an interlaced sheet (FIGS. 9–10 and 13–14). Advantageously, the tubular embodiments of the present invention do not require there to be a central support structure around which the wires are wound or, an outer or inner support structure within which the wires reside in a formed electrical contact configuration, since the combination of interlacing and annealing wires 8 removes the need for any additional integral or over-layed, co-extruded, or over-molded structural support. In other words, the electrical contacts can be operated for their intended purpose while simply comprising a mesh that has been manipulated to take a shape suitable for interconnecting two or more adjacent structures. It is in this sense then that electrical contacts 2 of the present invention are said to comprise an unsupported structure, also referred to herein as, stand alone.

In one woven or interlaced embodiment, eight stainless steel wires 8 are woven together to form a tubular electrical contact 2. In this arrangement, each wire 8 takes a helical path so as to be interlaced with each adjacent wire 8, while at the same time, each wire 8 only undergoes a substantially elastic deformation, i.e., each wire 8 would exhibit bending properties wholly consistent with the elastic limit portion of its underlying material's characteristic "stress-strain" or "force-deflection" curve. Substantially no plastic deformation is caused to occur in wires 8 during this manufacturing step. Also, it should be understood that at the points of intersection/overlap 9 of wires 8 in mesh 40, no bonding or other mechanical interconnection exists between the adjacent portions of wires 8. As a result of this structural arrangement, the adjacent portions of each wire 8 that define each of the intersection/overlap points 9 are movable relative to one another. It has been found to be effective, in braided or interlaced structures, that mechanical stability may be achieved when the ratio of the diameter of the contact and the lay length is smaller than about one-half, when cut into short segments even after annealing, where the lay length is the length per wire turn. Thus electrical contacts having a diameter greater than 10 mils may be manufactured with adequate results.

Significantly, once interlaced the tubular electrical contact is annealed so as to stress relieve wires 8, particularly at the plurality of intersection/overlap points 9. Metals, such as stainless steel and copper, comprise a generally cubic crystal structure. It is the particular variation of this crystalline structure (face centered cubic) that gives these metals their ductility allowing for elastic bending of wires 8 into curved shapes, e.g., by wrapping or folding about a removable mandrel 20 (FIG. 1L). However in the present invention, wires 8 suffer no such defect dislocation or plastic deformation during weaving. Instead, annealing elastically deformed wires 8 in mesh 12 substantially eliminates the elastic strain stored within the wires so that slippage of the metal crystals occurs in a controlled manner. In this way, the metal is composed of regular crystals that have taken a set in their interlaced configuration by relieving the elastic strain induced in each wire by the interlacing or weaving process. Thus, instead of wires 8 springing apart when cut into individual electrical contacts 2, they tend to maintain their combined structural integrity, and remain woven or interlaced together.

The annealing process is significant in this invention as a means to produce electrical contact comprising spring structures having relatively small dimensions. The structure of the present invention is often of such a small dimension that it is difficult to use conventional bending and forming processes. If a tubular structure were to be formed by plastic deformation, the cross-section of the individual wires will also be severely deformed at the same time which is not desirable for mechanical performance.

Figure 11:
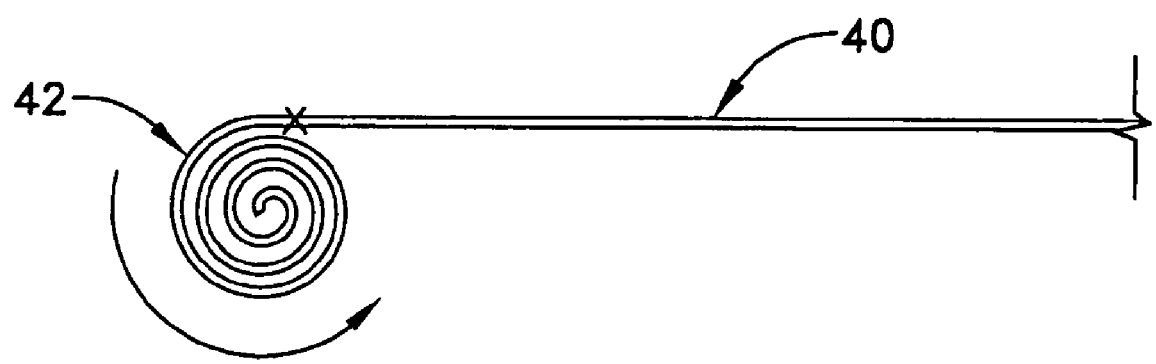
FIG. 11 is a top view of the mesh shown in FIG. 9, illustrating the process of being rolled into a tubular contact in accordance with the present invention.

In the present invention, the forming of the structure involves only essentially elastic deformation in rolling, braiding, and other processes. Under elastic deformation the formed structure cannot be maintained without a supporting constraint, otherwise the structure will fall apart as a result of elastic rebound. Advantageously, electrical contacts of the present invention may be formed by constraining them in a precursor form, then annealing them at a sufficiently high temperature together with the stored elastic stress, dislocations will be generated and moved to permanently set the shape of the electrical contact thus relaxing the stored elastic strain. The extent of deformation in the elastic range is limited so that the shape of the wire cross-section, for example, will not be altered and it will be easier to design the die or other means of constraint. A folded or pleated structure may be formed by annealing the structure, while still elastically deformed in a properly designed die or other fixture which serves as the constraint. For a rolled electrical contact structure, a properly designed constraint to maintain the tubular form is necessary during annealing. In one embodiment, mesh 40 is wrapped upon itself so as to form a plurality of overlapping layers providing a substantially helical structure to the tube (FIG. 11). In the case of a braided tubular structure, before cutting, the structure itself acts as a constraint during annealing.

The annealing of mesh 40 relieves the elastic strain that is inherent in wires 8 as a result of the weaving process, particularly at intersection/overlap points 9 where wires 8 are elastically deformed so as to bend or curve. Absent this annealing step and structure, wires 8 and mesh 40 would simply spring apart in the absence of any additional internal or external support structure affixed to mesh 40, e.g., a polymeric or elastomeric support core or shell. The combination of weaving individual wires 8 into a structure having inherent macro-elastic properties, with an annealing step to set the individual wires 8 in their woven or interlaced structural arrangement, provides for significantly enlarged force deflection properties. Thus when interlaced into mesh 40 according to the invention, and then annealed, plurality of wires 8 provide a resilient electrical contact structure having a significantly increased elastic range. To maintain a good surface condition heat treatment should be carried out in a controlled atmosphere furnace at the appropriate temperature for the particular grade of stainless steel or, in a less preferred embodiment, alloy of copper which may also be oil quenched to achieve maximum hardness.

According to the present invention, electrical contact 2 may be fabricated from three, four, or more loosely woven or braided conductive fibers or wires using, e.g., a conventional wire braiding machine (not shown).

Suitable electrically-conductive fibers or wires include virtually any fiber material having a bulk resistivity below about 100 $\mu\Omega$/cm, and preferably about 2 to 5 $\mu\Omega$/cm. Typically, the electrically-conductive fibers will be conductive metal wires, such as, tungsten and its alloys, stainless steel or alloys of copper, that may have portions coated with highly conductive metals (identified by reference numeral 25 in FIG. 2), such as, silver, palladium, rhodium, gold, and the various alloys thereof. Alternatively, suitable electrically conductive fibers can be prepared by modifying electrically insulating fibers, such as by introducing a conductivity-imparting agent such as metal particles to a natural or synthetic polymer or other material, such as carbon. While polymer composites may not be able to withstand typical annealing temperature, a ceramic/metal composite may be used with good effect.

Figure 7:
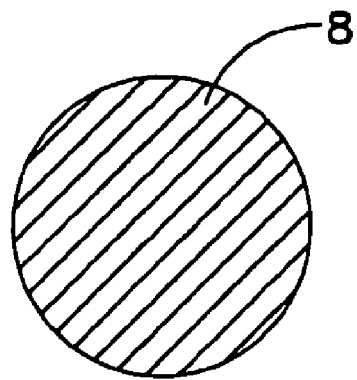
FIG. 7 is a cross-sectional view of a wire of the type used in forming the electrical contact of the present invention.
Figure 8:
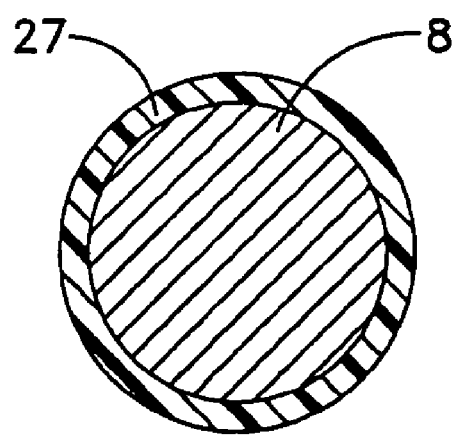
FIG. 8 is a cross-sectional view, similar to FIG. 7, but showing an insulating layer placed on the outer surface of wire.
Figure 9:
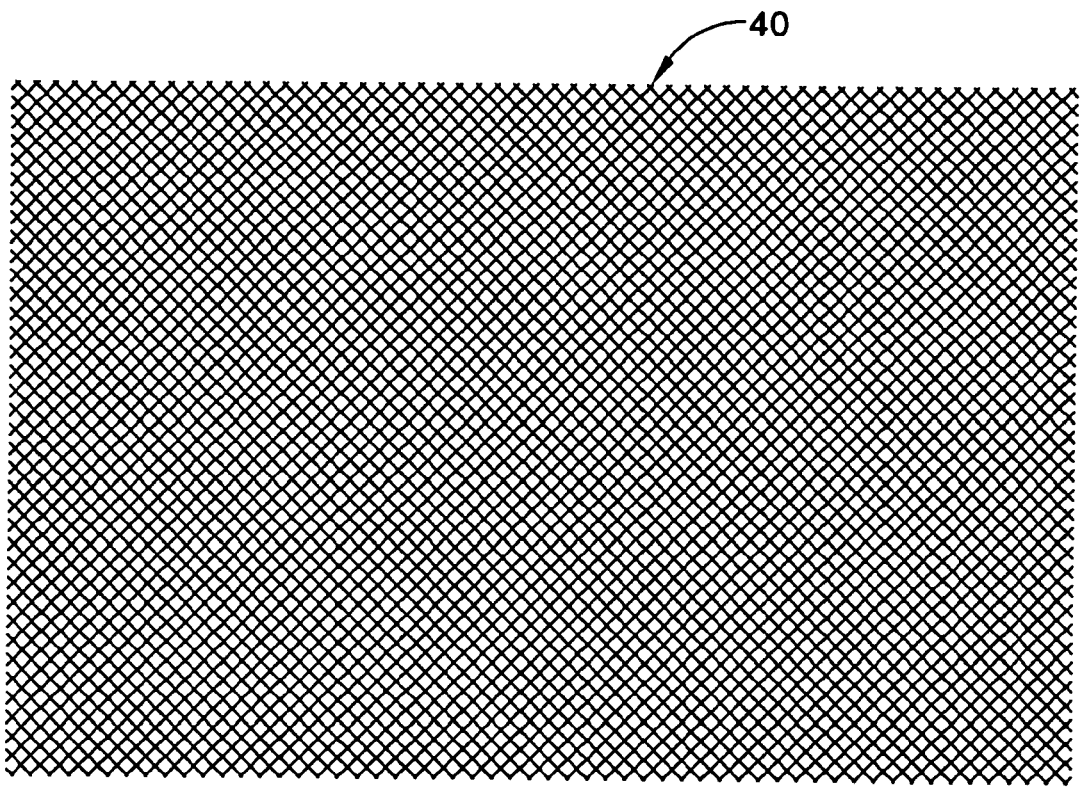
FIG. 9 is a top elevational view of an embodiment of wire mesh used to form an electrical contact in accordance with an embodiment of the present invention.
Figure 10:
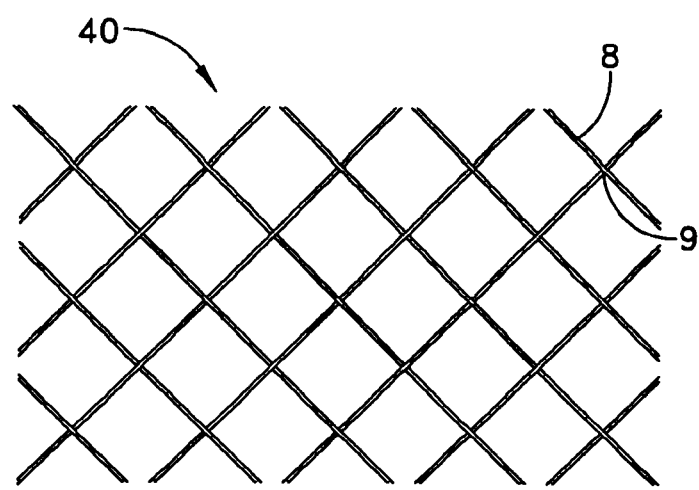
FIG. 10 is a magnified view of the mesh shown in FIG. 9.

Typically, electrically-conductive wires suitable for use in the present invention will have a diameter in the range from about 0.025 to 0.1 millimeters. The spacing between adjacent conductors are typically in the range from about 0.1 to 0.5 millimeters as measured between opposing wire intersection points 9. Referring to FIGS. 7 and 8, wires 8 may either be bare or have an insulation coating 27 applied to their outer surface. In all cases, the weave should be sufficiently loose, with gaps or interstices remaining between adjacent wires 8 so that during longitudinally applied compression, wires 8 form a plurality of elastically deformable beam-sections so as to provide a required spring force. The compliance of the mesh structure will depend upon several factors, including its cross-sectional dimensions, openings that vary in size, wherein the size is measured by the ratio of the height and width of the mesh opening 3, e.g., an array of rhomboidally shaped or diamond shaped openings 3. A mesh 40 may be formed with an array of diamond shaped openings having varying ratios of the height and width of the mesh opening. The smaller the ratio, the higher will be the compliance at low applied force. Thus, compliance of the electrical contact is determined by a ratio of the long axis and the short axis of the openings and the cross sectional dimensions of the beam sections of wires 8. Advantageously, electrical contact 2 is subjected to an annealing process so as to substantially set each individual wire 8 in its bent or curved shape and as a structural element or constituent of or interlaced mesh 12. Annealing for a stainless steel wire is conducted at temperatures ranging from about 500° C. to about 600° C., with about 550° C. being preferred for most applications. According to another preferred embodiment, annealing is conducted in a range of 550° C. to 650° C., with about 625° C. being preferred for most applications.

Electrical contact 2 may be formed by forming an electrical contact precursor mesh 40 as a or interlaced sheet 40, wherein the or interlaced sheet 40 is shaped to the shape of an unsupported, stand alone electrical contact 2 by being formed in a cage configuration, including but not limited to, either a tubular or tube configuration, FIG. 1H, a square, FIG. 1J, a rectangle, FIG. 1K, or other form of cage configuration with open ends for edgewise electrical connection, or by being formed into a corrugated sheet 40 configuration that has one or more pleats, folded pleats or unfolded pleats, for edgewise electrical connection. Advantageously, the tubular or cage embodiments of the present invention, and the corrugated sheet 40 embodiments, of the present invention do not require there to be a central support structure around which the mesh 40 is wound or, an outer or inner support structure within which the mesh 40 resides in a formed electrical contact configuration, since the combination of a or interlaced sheet 40 or mesh 40 while annealing the mesh 40 removes the need for any additional integral or over-laid, co-extruded, or over-molded structural support. In other words, the electrical contacts 2 can be operated for their intended purpose while simply comprising a mesh 40 that has been manipulated to take a shape suitable for interconnecting two or more adjacent structures or opposing electronic components. It is in this sense then that electrical contacts 2 of the present invention are said to comprise an unsupported structure, also referred to herein as stand alone.

Typically, electrically-conductive beam-sections 6 suitable for use in the present invention will have a minimum cross sectional dimension in the range from about 0.025 to 0.1 millimeters. The diagonal dimensions of the diamond shaped openings 3 between adjacent beam-sections of wires 8 are typically in the range from about 0.1 to 0.5 millimeters.

The present invention provides an electrical contact 2 that comprises a large elastic range as a result of being formed as an annealed metal structure that provides a plurality of individual beam-sections of wires 8.

Annealing is performed while the mesh 40 is being shaped to the shape of at least one electrical contact 2, and preferably while the mesh 40 is being shaped to the shape of one or more electrical contacts 2. Annealing substantially eliminates or substantially relieves internal elastic strain in each electrical contact 2. The substantial elimination or relief of internal elastic strain enables the contact 2 to maintain a compact shape without the contact 2 enlarging or warping by springing action to relieve internal elastic strain. Further, the substantial elimination or relief of internal elastic strain enables each electrical contact 2 to undergo relatively large amounts of deflection in the elastic range before reaching an elastic limit, which avoids permanent deformation of the contact 2 when the contact 2 deflects compliantly under compression while making an electrical connection. Further, the large range of deflection in the elastic range provides a wide range of compliancy when making an electrical connection.

Figure 4:
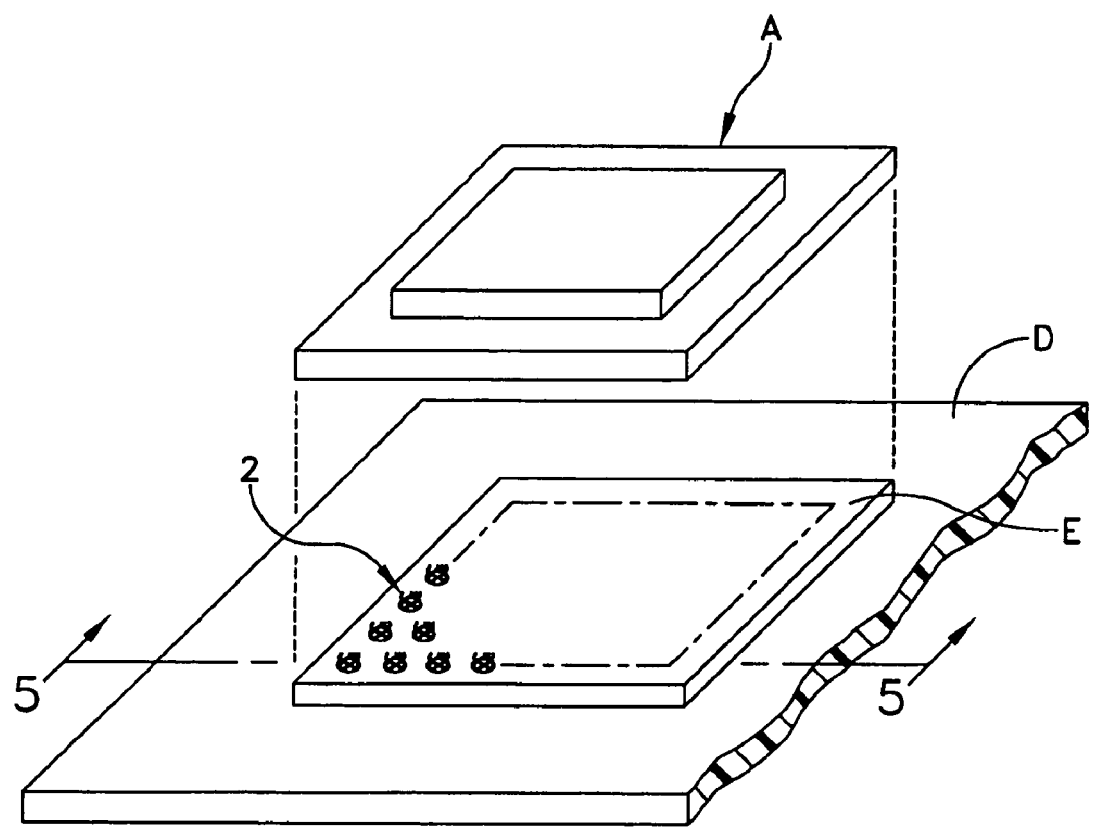
FIG. 4 is a perspective view of a land grid array assembly, similar to that shown in FIG. 1, but incorporating electrical contacts formed in accordance with the present invention.
Figure 5:
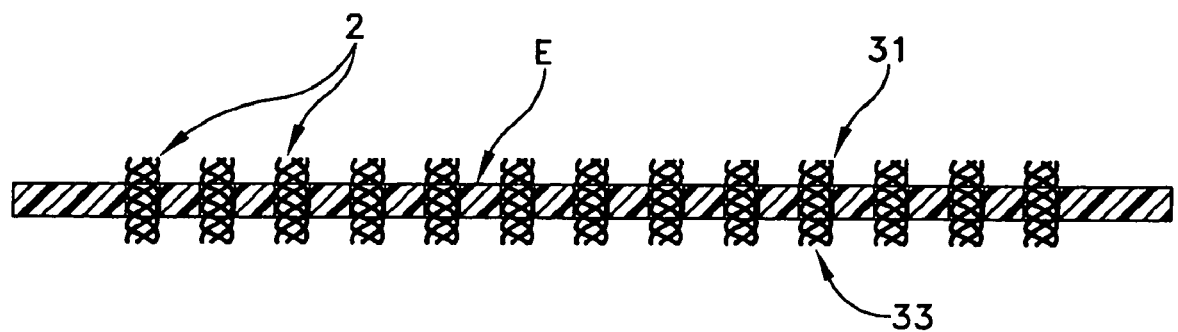
FIG. 5 is a cross-sectional view of the land grid array assembly shown in FIG. 4.
Figure 6:
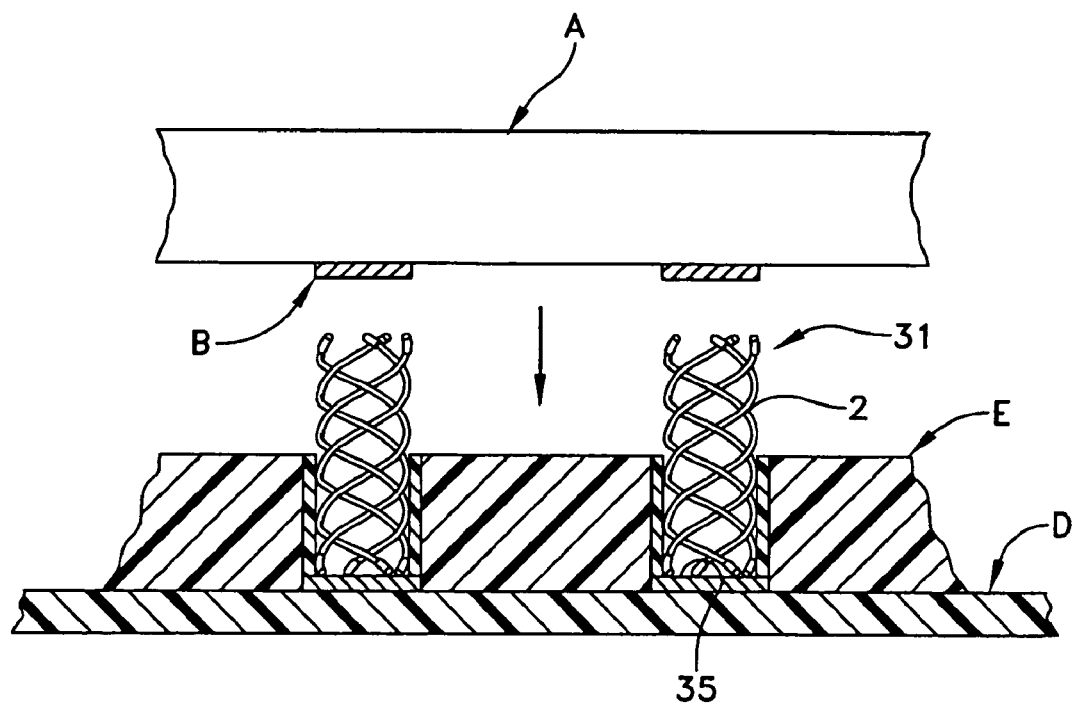
FIG. 6 is a side cross-sectional view, partially broken-way, of the land grid array assembly shown in FIG. 4.

Referring to FIGS. 4, 5, and 6 an IC package A may be electrically connected to trace circuits on PCB D using an LGA assembly comprising electrical contacts 2 in accordance with the present invention. Each electrical contact 2 is positioned within a passageway formed in housing E such that a first end 31 of each electrical contact 2 is positioned above a surface of housing E, and a second end 33 is positioned below a surface of housing E (FIG. 5). Alternatively, a housing having a plurality of blind openings 35 arranged in an array that corresponds with the array of contact pads B on IC package A such that an inner connection can be made between IC package A and circuit traces located on or in PCB D.

Figure 12:
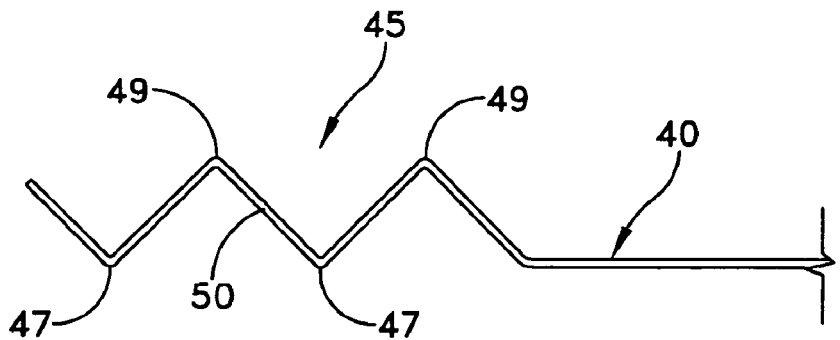
FIG. 12 is a top end view of a portion of the mesh shown in FIG. 9, after pleating so as to form yet another embodiment of the present invention.
Figure 13:
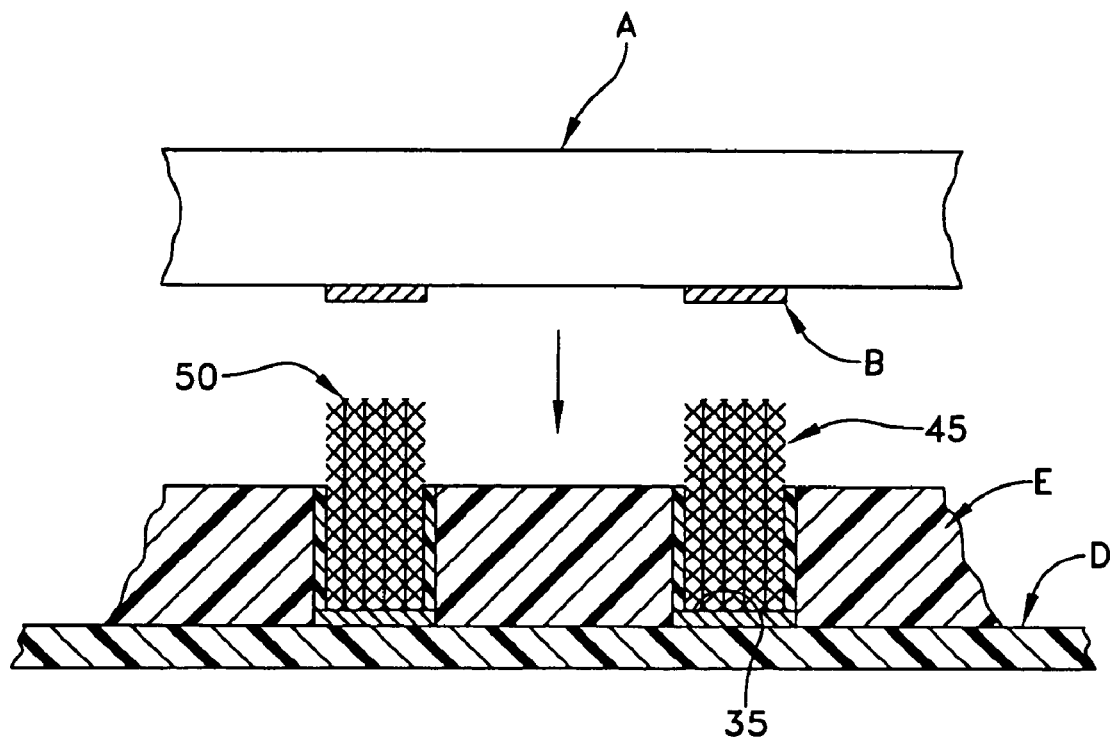
FIG. 13 is a broken-way, cross-sectional view of a land grid array assembly, similar to that shown in FIG. 6, but incorporating a pleated mesh electrical contact.
Figure 14:
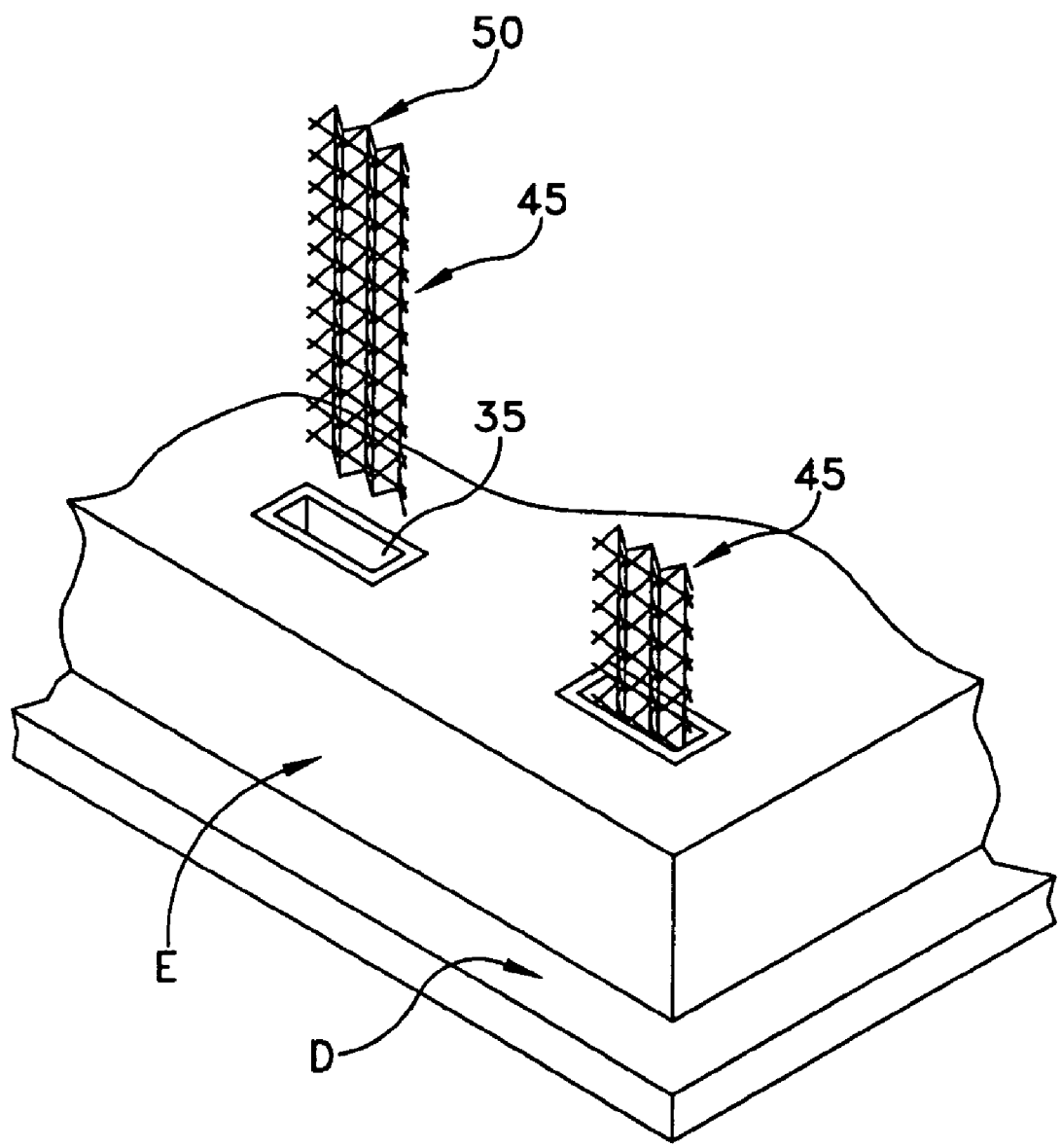
FIG. 14 is a broken-away, perspective view of an interconnection system incorporating individual pleated electrical contacts formed in accordance with the present invention.

In one alternative embodiment of the invention, wires 8 may be or interlaced into an initially flat mesh 40 (comprising warp and weft wires) which then may be formed so as to create a variety of contact structures. For example, mesh 40 may be rolled upon itself so as to form a rolled contact 42 (FIGS. 11 and 12). Mesh 40 is wrapped upon itself so as to form a plurality of overlapping layers providing a substantially helical structure to rolled contact 42 (FIG. 11). Each rolled contact 42 may then be cut from mesh 40 and assembled within a suitable housing as disclosed herein-above. Alternatively, mesh 40 may be folded so as to create a plurality of pleats 45 defined by a plurality of troughs 47 and ridges 49. A contact edge 50 is defined along the perimeter of pleats 45. Pleated electrical contacts 45 may then be cut from mesh 40 and positioned within a plurality of passageways or openings 35 within housing E such that contact edge 50 is positioned in spaced confronting relation to contact pads B (FIG. 14). In this way, pleats 45 act to support the contact within openings 35. In operation, as IC package A is moved toward housing E, contact pads B engage contact edge 50 of pleated electrical contact 45 thereby deforming pleated electrical contact 45 to produce a resultant contact force. Here again, annealing pleated contact 45 or rolled contact 42 allows for a set to be created in wires 8. In the case of pleated electrical contacts 50, a suitable forming tool, having a pleated punch and die set, may be closed on mesh 40 during the annealing process in order to maintain the structural arrangement in elastically formed wires 8. The or interlaced sheet 40 is first made into a corrugated sheet 40 of an appropriate amplitude which is of the order of the diameter of the retention hole in an interposer. A die of a top piece and a bottom is used to deform the sheet 40 into the desired shape. The deformation involves a combination of elastic deformation and plastic deformation. Under the constraint of the die the sheet 40 is annealed at an elevated temperature adequately to set the desired corrugated shape, and substantially relieve internal elastic strain. According to another preferred embodiment, after annealing the sheet 40 is first cut into long strips the width of which is the height of the contact element 2. The strip is then cut into pieces of desired width to produce the electrical contact element 2.

Advantageously, electrical contacts 2 of the present invention may be formed by constraining them in a precursor form, then annealing them at a sufficiently high temperature together with the stored elastic strain, and dislocations will be generated and moved to permanently set the shape of the electrical contacts 2, thus relaxing the stored elastic strain and substantially relieving the same. The extent of deformation in the elastic range is limited so that the shape of the beam section 6 cross-section, for example, will not be altered and it will be easier to design the die or other means of constraint. A folded or unfolded pleated structure may be formed by annealing the structure, while still elastically deformed in a properly designed die or other fixture which serves as the constraint. For a rolled electrical contact structure, a properly designed constraint to maintain the tubular form of the structure is necessary during annealing.

To maintain a good surface condition heat treatment should be carried out in a controlled atmosphere furnace at the appropriate temperature for the particular grade of stainless steel or, in a less preferred embodiment, alloy of copper which may also be oil quenched to achieve maximum hardness, and further oil quenched and strain hardened.

FIG. 1H, FIG. 1J and FIG. 1K are illustrated with outlines along the edges of the electrical contacts 2. However, the outlines represent cutting lines, where the edges of the electrical contacts 2 are cut to provide multiple contact points. Just like the tube, FIG. 1H, or other cage-like structure, FIG. 1J and FIG. 1K, the folded pleated structure or unfolded, pleated structure thus produced will provide multiple electrical contact points along edges of the electrical contacts 2 from the top edge and from the bottom edge, the number of which contact points will depend on the size of the perforation 3, for edgewise electrical connection. Electrically it should also perform like a weaved structure in terms of inductance and electrical conductance.

The sheet material of the or interlaced sheet 40 preferably has a high yield strength. The yield strength is enhanced by hardening due to forming the sheet 40 with a limited amount of inelastic deformation, in addition to elastic deformation. It should be able the retain its yield strength after processing the hardened sheet 40 by annealing, which substantially relieves only the elastic deformation. For example, annealing is performed to set the shape of a corrugated structure, such as, the unsupported, stand alone electrical contact 2 in accordance with the present invention, including embodiments of the present invention, wherein a mesh 40 is made by a or interlaced sheet 40 that is formed in a tube or cage structure having folds, or is corrugated to form pleats. Each pleat comprises either a folded pleat or an unfolded pleat. The material can be a monolithic metallic alloy or a metal composite.

Figure 2A:
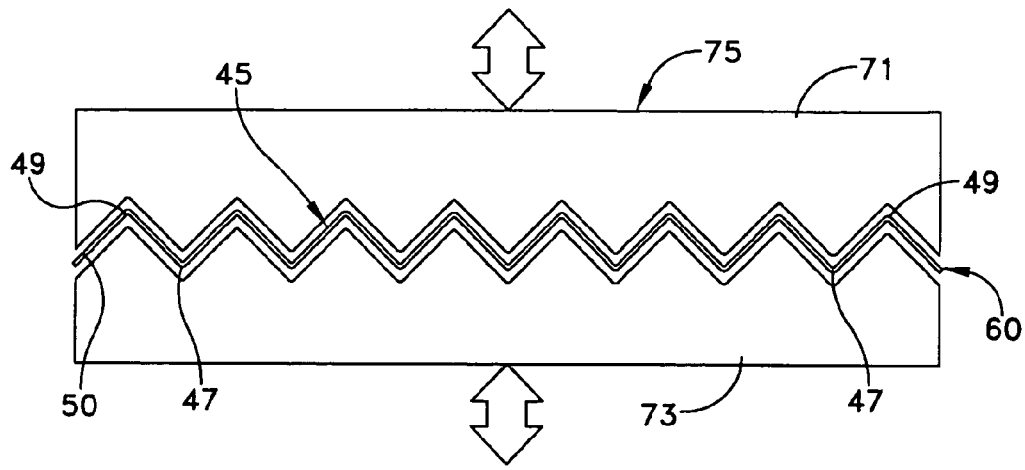
FIG. 2A is an edgewise view of an interlaced sheet during shaping thereof in a die to a shape of one or more electrical contacts.
Figure 2B:
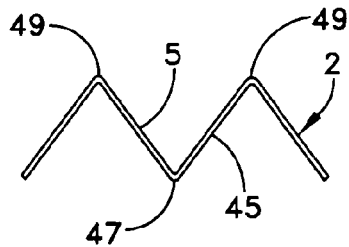
FIG. 2B is a top view of a small piece of a pleated structure in the form of an electrical contact.
Figure 2D:
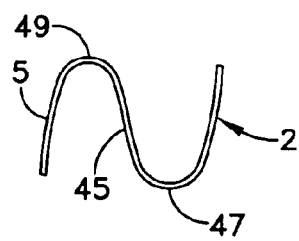
FIG. 2D is a top view of a small piece of a pleated structure in the form of an electrical contact.
Figure 2C:
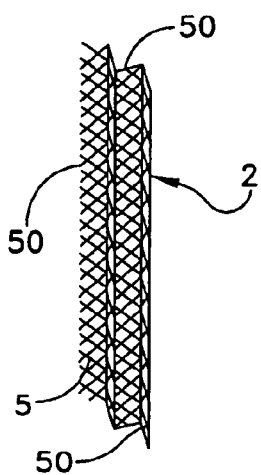
FIG. 2C is an isometric view of the small piece shown in FIG. 2B in the form of an electrical contact.

With reference to FIGS. 2B and 2C, an embodiment of an electrical contact 2 cut from a or interlaced sheet 40 of an appropriate width to height ratio can be folded into an unsupported, stand alone folded structure to produce mechanical stability under displacement. An unfolded embodiment is disclosed in FIGS. 2D and 2E.

When viewed from above, edgewise of the sheet 40, the sheet 40 can be formed into a tube shape according to the shape of an individual contact 2, wherein the individual contact 2 is an enclosure, an unsupported, stand alone structure, according to which the unsupported, stand alone structure can have a shape of a folded square, FIG. 1J, a folded rectangle, FIG. 1K, an unfolded rounded tube, FIG. 1H, or other cage configuration for edgewise electrical connection of the sheet 40. For example, the sheet 40 is formed by wrapping and folding the sheet 40 over a mandrel 2a, FIG. 1L, that has a cross section shape to which the sheet conforms to assume the desired shape of at least one contact 2, and preferably one or more contacts 2. The tube shape of the sheet 40 has an axial or longitudinal open seam. The tube form of the sheet 40 comprises at least one electrical contact 2, and preferably one or more electrical contacts 2. The sheet 40 is annealed while being held in the tube shape to substantially relieve elastic strain. Further, the sheet 40 is easily formed by bending and folding the sheet to assume an M-shape, or other shapes. The M-shaped structure is easy to make, the method of manufacturing for which will be described. The method of manufacture applies for making the folded embodiment of FIGS. 2B and 2C, and for making the unfolded embodiment disclosed in FIGS. 2D and 2E.

A corrugated or interlaced sheet 40 is shown edgewise, having an edge 50 in FIG. 2A. The corrugated shape can be produced by compressing a or interlaced sheet 40 between mating or nesting die sections 71 and 73 of a forming die 75, wherein the nesting die sections 71 and 73 are two pieces having desired shapes at corrugated mating faces that close toward one another and form therebetween the or interlaced sheet 40 to a corresponding corrugated shape that conforms to the mating faces. The die sections 71 and 73 separate to permit removal of the or interlaced sheet 40 that has been formed or shaped into a corrugated shape, the shape of at least one electrical contact 2, and preferably to the shape of one or more electrical contacts 2. While constrained in the die 75, annealing at an elevated temperature is performed to set the shape or each electrical contact 2 in the or interlaced sheet 40 permanently, while such annealing substantially relieves solely the elastic strain. The annealing temperature is selected below a temperature that would reduce any yield strength. Thus, annealing retains substantial amounts of yield strength. To recover some of the lost yield strength due to annealing, the sheet 40 can be hardened by a controlled amount of inelastic deformation, by being formed a second time, to a more compact corrugated shape.

Figure 2E:
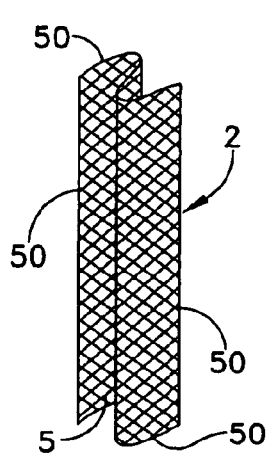
FIG. 2E is an isometric view of the small piece shown in FIG. 2B in the form of an electrical contact.

After annealing, the sheet 40 is in a strain relieved corrugated configuration, and is cut to the height of the contact element 2, as shown in FIG. 2C and FIG. 2E. For example, the sheet 40 comprises one or more strips, wherein the width of each strip equals the height of a contact element 2. Each strip comprises at least one electrical contact 2, and preferably one or more electrical contacts 2. Thereby, after being shaped to at least one electrical contact 2, and preferably one or more electrical contacts 2, while being annealed, the sheet 40 is divided into strips, and the width of each strip is the height of an contact element 2.

Alternatively, prior to being shaped in the die 75, the sheet 40 comprises one or more strips, wherein each strip is the height of the electrical contact 2. Each strip comprises at least one electrical contact 2, and preferably one or more electrical contacts 2, prior to being shaped and constrained in the die 75, while being annealed. Thereby, the sheet 40 is partly shaped to that of an individual contact 2 by being cut to the height of an individual contact 2.

Before each strip of the sheet 40 is further cut into smaller pieces 5, the edges 50 of each sheet 40 that has been cut to the height of the contact element 2 are applied with, for example, are plated with, nickel, serving as a barrier to formation of an inter-metallic due to metal migration. Then a coating of a highly conductive and noble metal is applied over the barrier of nickel. Alternatively each of the smaller pieces have their edges 50 applied with a barrier and a highly conductive and noble metal. The conducting edges 50 provide multiple points of electrical contact that are made highly conductive, when applied with the highly conductive and noble metal. Alternatively, the entire or interlaced sheet 40 is applied with a barrier and a highly conductive and noble metal to decrease the bulk resistivity.

Each of the strips is further cut into smaller pieces 5 of the sheet 40 to produce individual contact elements 2. The contact element 2, in FIG. 2C, is shown in its top view in FIG. 2B.

According to another embodiment, to recover or restore some of the lost yield strength due to annealing, the electrical contact 2 is hardened by a preconditioning operation, wherein the entire contact 2 is compressed axially in a direction, open end to open end, with sufficient deformation under compression to increase hardening due to a controlled amount of inelastic deformation, or plastic flow, substantially throughout the mesh 40. Thereby, the electrical contact 2 has an enhanced yield strength compared to a lower yield strength following annealing.

The small piece 5 may be given a second anneal under an elastic constraint to set the shape of a tighter structure compared to that of the sheet 40. For example, the tighter structure refers to an electrical contact 2 having a compacted cross-section to fit within a retention hole 8 of less than 10 mils cross-sectional dimension or diameter.

Figure 2F:
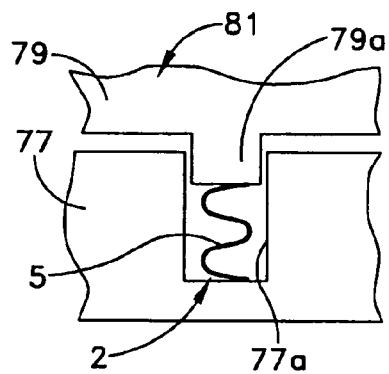
FIG. 2F is an edgewise view of a small piece of a pleated structure during shaping thereof to the shape of a compact electrical contact.

FIG. 2F discloses that the small corrugated piece 5 is further shaped into a more compact shape of an electrical contact 2, when the small piece 5 needs a more compact corrugated shape that can be produced by the die 75, in FIG. 2A. For example, the die 75 may have dimensional limitations that limit how small the corrugations can be made. To make a corrugated shape of a more compact electrical contact 2, first, the small piece 5 is shaped with a corrugated shape, in the manner, as disclosed by FIG. 2A, and is subjected to a first anneal by a first annealing process. Then the corrugated small piece 5 is removed from the die 75 and is further shaped to form a more compact electrical contact 2. The corrugated small piece 5 is inserted between mating or nesting die sections 77 and 79 of a forming die 81. For example, the corrugated small piece 5 is oriented sideways in a die cavity 77a of the die section 77. The mating die section 79 has a ram 79a that inserts along the die cavity 77a to compress and elastically deform the corrugated small piece 5 to a more compact shape of an electrical contact 2. In an alternative embodiment, a limited amount of permissible added compression produces a limited amount of inelastic deformation of the small piece 5 to a more compact shape, which supplements the elastic deformation. While remaining under elastic constraint in the die cavity, the corrugated small piece 5 is subjected to a second anneal by a second annealing process. The second annealing process sets the shape of the compact corrugated small piece 5 to the shape of a compact electrical contact 2, substantially free of only the elastic strain.

According to another embodiment, to recover some of the lost yield strength due to a second anneal, the electrical contact 2 is hardened by a preconditioning operation, wherein the entire contact 2 is compressed axially in a direction, open end to open end, with sufficient deformation under compression to cause a limited amount of inelastic deformation, or plastic flow, substantially throughout the mesh 40. Thereby, the electrical contact 2 has an enhanced yield strength.

FIGS. 2B and 2C disclose an embodiment of an individual electrical contact 2 in accordance with the present invention, wherein a mesh 40 made by a or interlaced sheet is corrugated to form the pleats 45 having at least one trough 47 and at least one peak 49. Each corrugation is doubled back on itself to form an adjacent pair of pleats. FIGS. 2B and 2C disclose a folded pleat, wherein each corrugation is doubled back on itself and folded, which defines a fold at each trough 47 between adjacent pleats 45, and another fold at each peak 49, between adjacent pleats 45. Thus the corrugations form folded pleats 45. FIGS. 2B and 2C are illustrated with outlines along the edges of the electrical contacts 2. However, the outlines represent cutting lines, where the edges of the electrical contacts 2 are cut to provide multiple contact points.

FIG. 2D and FIG. 2E disclose another embodiment of an individual electrical contact 2, wherein a mesh 40 made by a or interlaced sheet is corrugated to form the pleats 45 having at least one trough 47 and at least one peak 49. Each corrugation is doubled back on itself to form an adjacent pair of pleats. FIGS. 2D and 2E disclose an unfolded pleat, wherein each corrugation is doubled back on itself without being folded between adjacent pleats 45. Thus the corrugations form unfolded pleats 45. To form the unfolded pleats 45 in the mesh 40, the die sections 71 and 73 are modified to have corrugated mating faces with curved bends at the troughs 47 and the peaks 49, such that the mesh 40 is shaped therebetween with conforming unfolded pleats 4 having curved bends at the troughs 47 and the peaks 49. FIGS. 2D and 2E are illustrated with outlines along the edges of the electrical contacts 2. However, the outlines represent cutting lines, where the edges of the electrical contacts 2 are cut to provide multiple contact points.

Mesh 40 may be corrugated so as to create a plurality of pleats 45 defined by a plurality of troughs 47 and ridges 49. Pleated electrical contacts 2 may then be cut from mesh 40. A contact edge 50 is defined along each of the perimeter edges 50 of pleats 45 for edgewise electrical connection. The perimeter edges 50 are cut edges of the mesh 40. The cut edges of the mesh 40 intersect the beams or beam sections 6 at the boundaries of the mesh openings 3 to provide intersected beams or beam sections 6 along the edges 50. The intersected beams or beam sections 6 at and distributed along the edges 50 provide multiple contact points along the perimeter edges 50, which advantageously increase the number of electrical conduction paths through each contact 2. Thus, each contact 2 is a mesh 40 that provides multiple contact points along the perimeter edges 50 of the mesh 40, which contact points establish corresponding, multiple electrical connections with and for the contact 2.

Further, the pleated electrical contacts 2 are positioned within a plurality of passageways or openings 35 within housing E such that contact edge 50 is positioned in spaced confronting relation to contact pads B (FIG. 6). In this way, pleats 45 act to support the contact within openings 35. Further, the multiple contact points along the perimeter edges 50 of the mesh 40 provide multiple contact points against the sides of the openings 35. Thus, each contact 2 is supported mechanically by multiple contact points against the sides of the openings 35.

In an alternative embodiment, the sides of the openings 35 are electrically conducting, for example, by being lined with plated conductors. Thereby, each contact 2 establishes multiple points of electrical connection with the conducting sides of the openings 35.

In operation, as IC package A is moved toward housing E, contact pads B engage contact edge 50 of each pleated electrical contact 2 thereby deforming the pleated electrical contact 2 to produce a resultant contact force. Further, the contact 2 resiliently deflects under compression in a direction inwardly of the opening 35 which makes the contact 2 compliant to different dimensions when compressed. Here again, annealing pleated contact 2 allows for a set to be created, substantially relieved from internal elastic strain.

Figure 3A:
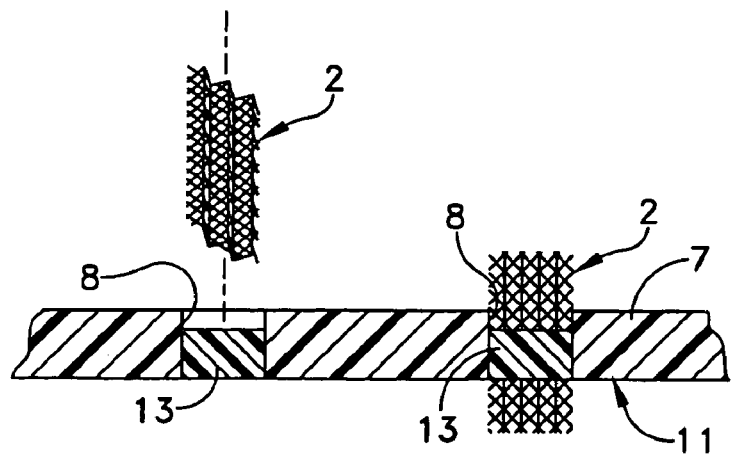
FIG. 3A is a fragmentary side view or elevation view of an embodiment of an interposer with a retention hole having an exemplary contact element and an adhesive therein.
Figure 3B:
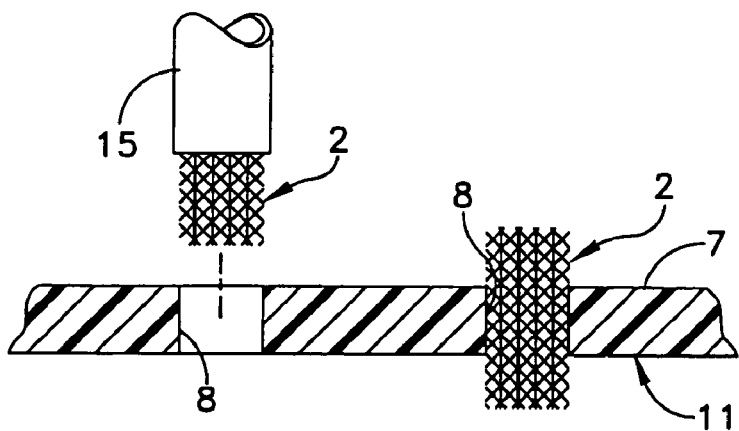
FIG. 3B is view similar to FIG. 3A, and disclosing an embodiment of an interposer with a retention hole having an exemplary contact element retained by elastic expansion of one or more protrusions in the retention hole.
Figure 3C:
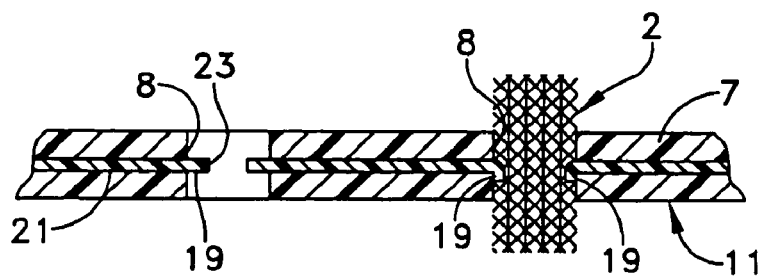
FIG. 3C is a view similar to FIG. 3A, and disclosing an embodiment of an interposer with a retention hole having an exemplary contact element retained by elastic expansion of the contact element.

Three preferred designs of an interposer are shown in FIGS. 3A, 3B and 3C, respectively. A carrier E is shown with an array of retention holes 8, also referred to as passageways 8.

An interposer has a carrier E retaining electrical contact elements 2 arranged in an appropriate array to connect corresponding contact pads of two mating components e.g. an electronic package and a substrate, for example, a printed-circuit-board, PCB to be interconnected. The substrate includes, but not limited to, a PCB, a patterned semiconductor wafer and a semiconductor transmission line. The contact elements 2 are interposed between the opposing contact pads, respectively, on the two mating components. The contact elements 2 are compressed inwardly relative to the thickness of the carrier E. Further the contact elements 2 are resiliently deflected in the thickness plane of the mesh 40, and thereby, provide a contact force for interconnecting the two mating components. Accordingly, the thickness of the carrier E has to be minimal in order to avoid interfering with the deformation of the contact element 2, but should be adequate to support the alignment of the contact element 2 under repeated loading and unloading like in the case of a test socket making repeated interconnections and disconnects of the contact elements 2 with devices being tested by the test socket.

The coefficient of thermal expansion of the carrier E preferably matches that of the two mating components. The location of the holes in the carrier that retains the contact element 2 should match that of the contact pad of the mating components.

FIG. 5 discloses another embodiment of an interposer, also referred to as a land grid array, LGA, an assembly comprising electrical contacts 2 in a carrier E. The carrier E is also referred to as a housing E, in accordance with the present invention. Each electrical contact 2 is positioned within a retention hole in the form of a passageway 8 formed in housing E such that a first end 31 of each electrical contact 2 is positioned above a surface of housing E, and a second end 33 is positioned below a surface of housing E.

FIG. 6 discloses another embodiment of an interposer, wherein the carrier E, referred to as a housing E, has a plurality of retention holes in the form of blind openings 35 arranged in an array that corresponds with, for example, the array of contact pads B on IC package A such that connections can be made, for example, between IC package A and circuit traces B, for example, located on or in PCB, printed circuit board D, thus, interconnecting the same. The PCB is one form of a substrate including, but not limited to, a PCB, a patterned semiconductor wafer and a patterned semiconductor transmission line. Each electrical contact 2 is positioned within a blind opening 35 such that a first end 31 of each electrical contact 2 is positioned above a surface of housing E, and a second end 33 is positioned at the bottom of a blind opening 35.

According to an embodiment of an interposer, disclosed by FIG. 6, each of the blind openings 35 is covered at one end thereof by a conducting pad 37 that forms an area of electrical connection at a corresponding bottom surface 39 of the housing E or carrier E. The second end 33 of a corresponding electrical contact 2 engages the conducting pad with multiple points of connection along the edge of the mesh that forms the electrical contact 2.

According to another embodiment of the interposer, disclosed by FIG. 6, the bottom surface 39 of the housing E or carrier E is substantially planar, for example, by machining. The substantially planar bottom surface 39 has each conducting pad 37 thereon for establishing an electrical connection with a corresponding contact 2 in a blind opening 35. Further, the substantially planar bottom surface 39 is useful for a test fixture for engaging a printed circuit board, PCB, a patterned semiconductor wafer and a patterned semiconductor transmission line, respectively, to test for planarity thereof. For example, the substantially planar bottom surface 39 is placed against a PCB to test for non-planarity. A non-planar PCB will cause localized gaps to occur between the non-planar PCB and respective conducting pads 37, whereas, a planar PCB will engage such respective conducting pads 37. Electrical test signals are supplied to the electrical contacts 2 that connect with the respective conducting pads 37. The test signals will detect whether the pads 37 connect with the PCB or are open circuited by the localized gaps with the PCB.

According to another embodiment of the interposer, disclosed by FIG. 6, the carrier E is a semiconductor substrate that is formed into a carrier E by semiconductor fabrication processes. For example, the conducting pads 37 are formed by first applying an etch resistant mask over the surface 39 of the carrier E, followed by patterning the mask by photo lithographic patterning and photo-developing the mask, leaving a pattern of vias or trenches, followed by etching the vias or trenches in the surface 39 of the carrier E, followed by filling the etched vias or trenches with electrolytically plated conductive material to form the conducting pads 37. Then, the opposite surface of the carrier E is photo-masked and selectively etched to form the blind openings 35 in the carrier E. Then, the bottom surface 39 of the housing E or carrier E is formed substantially planar, for example, by CMP, chemical mechanical planarization, wherein a polishing pad and a fluid polishing composition polishes the surface 39. Each contact 2 is assembled in a blind opening 35. The contact 2 engages edgewise with a corresponding pad 37 to establish an electrical connection therewith.

The materials of construction for the carrier E begins with a substrate including but not limited to, epoxy/glass composite, a sheet or film, for example, of Kaepton (Kapton), filled polymer, photosensitive polymer, semiconductor wafer, and others. An epoxy/glass composite is a glass fiber reinforced epoxy substrate for a PCB. The holes can be produced by drilling, laser drilling or a selective photo etch process. In general the location of a hole 8 is more precisely located when produced by a photo etch process compared to being produced by mechanical drilling or laser drilling. A photosensitive polymer is useful in the case where high precision in retention hole 8 location is desired, and obtained by masking selected parts of the photo-exposure polymer, then, photo-exposure of unmasked parts of the photo-sensitive polymer to photo-develop the same, followed by washing away the undeveloped photo-sensitive polymer, leaving a patterned mask, followed by etching an under layer of the substrate exposed by the patterned mask. A semiconductor wafer or substrate is useful for making a carrier E with retention holes 8 and/or blind openings 35 according to semiconductor manufacturing processes. Further, planarization by CMP, chemical mechanical planarization provides a planar polished surface on the substrate with minimized surface roughness and minimized surface planarity variation.

There are three preferred method of retention for the contact element 2 in a retention hole 8, including but not limited to, the blind opening 35, of a carrier E:

a) (FIG. 3A) Filling the retention hole 8 with a appropriate adhesive 13 to retain the contact element 2. In FIG. 3A the contact element 2 is shown to be retained by filling the retention holes with an adhesive 13. If the adhesive 13 fills the retention hole 8 completely it will prevent the top part of the contact element 2 from wetting by molten solder during reflow to solder the lower part of the contact element 2 to a printed-circuit board D.

b) (FIG. 3B) Use a pleated contact element 2, in the form of a folded pleats structure or unfolded pleats structure, with slightly larger horizontal profile dimensions compared to corresponding cross section dimensions of one of the retention holes 8. Compact the contact element 2 into a smaller horizontal profile by compacting the contact element in the end of a guide tube 15. Insert the compacted contact 2 into a retention hole 8, using guide tube 15. Removing the guide tube from the contact 2, such that the contact will expand resiliently in the hole 8, wherein the retention of the contact 2 in the hole 8 is achieved by the elastic expansion of the folded pleats structure or the unfolded pleats structure, after it has been compacted from its original size for insertion into the hole 8, followed by elastic expansion while being constricted in the hole 8. FIG. 3B shows the contact element 2, is slightly larger sized than the retention hole, 8. The contact element 2 is introduced with the aid of the guide tube 15. After the removal of the guide tube the retention of the contact element 2, is achieved by the elastic expansion of the contact element 2.

c) (FIG. 3C) Construct a carrier E with retention holes 8 containing elastic protrusions 19. Insert the folded structure also by a guide tube, not shown. After removal of the guide tube retention is achieved by constriction and the elastic expansion of the protrusions in the retention hole. FIG. 3C shows a carrier E having retention holes 8, containing elastic protrusions 19. Such protrusions 19 can be produced, for example, by laminating a polymer sheet 21 as an inner layer of the carrier E, wherein the polymer sheet 21 has a hole 23 of a smaller hole diameter compared to that of the retention hole 8 in the carrier E. A compacted contact element 2 in a guide tube can be inserted into the hole 8, while introduced with the aid of the guide tube, not shown for the compacted contact element 2 to intercept the hole 23 in the polymer sheet 21, and to resiliently deflect the protrusions 19 protruding in the hole 23. After the removal of the guide tube the contact element 2 is retained by the resilient stored energy tending to cause elastic expansion of the protrusion 19 against the contact 2.

It is to be understood that the present invention is by no means limited only to the particular constructions herein disclosed and shown in the drawings, but also comprises any modifications or equivalents within the scope of the claims.

What is claimed is:

1. An electrical connector suitable for electrically interconnecting confronting conductive pads, said electrical connector, comprising:
one or more electrical contacts, wherein each of the electrical contacts is in the form of an electrically conducting interlaced mesh that forms a tube having spaced-apart open ends defined by conducting edges, wherein the electrical contact is hardened, and wherein the conducting edges of the mesh tube provide multiple contact points for edgewise electrical connection by axial compression of the electrical contact so as to provide an electrical pathway to a conducting pad; and
a carrier spaced from at least one of said spaced-apart open ends and holding each of the electrical contacts for edgewise electrical connection.

2. The electrical connector of claim 1, wherein the carrier is a housing having blind openings, the electrical contacts are in the blind openings, a first end of each of the electrical contacts that comprises said multiple points disposed in substantially surrounding relation to said open end is positioned above a surface of the carrier, and a second end of each of the electrical contacts is located in the blind opening.

3. The electrical connector of claim 1, wherein the carrier is a housing having blind openings, one of said conducting pads cover the blind openings, and the electrical contacts are in the openings, wherein each electrical contact has a first end positioned above a surface of the carrier, and each contact has a second end that comprises said multiple points disposed in substantially surrounding, peripheral relation to said open end engaging one of the conducting pads.

4. The electrical connector of claim 1, wherein, the carrier is a housing having blind openings, conducting pads at a bottom surface of the carrier cover the blind openings, the electrical contacts are in the openings, each electrical contact has a first end positioned above a surface of the carrier, each contact has a second end that comprises said multiple points disposed in substantially surrounding, peripheral relation to said open end engaging one of the conducting pads, and the bottom surface of the carrier is substantially planar.

5. The electrical connector of claim 1, wherein each electrical contact is in a retention hole of the carrier, and wherein an adhesive in the retention hole retains the electrical contact.

6. The electrical connector of claim 1, wherein each electrical contact is in a retention hole of the carrier, and wherein one or more protrusions in the retention hole retain the electrical contact.

7. The electrical connector of claim 1, wherein each electrical contact is constricted in a retention hole of the carrier to retain the electrical contact in the retention hole.

* * * * *